(12) United States Patent
Takai

(10) Patent No.: US 8,488,330 B2
(45) Date of Patent: Jul. 16, 2013

(54) CIRCUIT MODULE

(75) Inventor: Kiyofumi Takai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 275 days.

(21) Appl. No.: 13/079,940

(22) Filed: Apr. 5, 2011

(65) Prior Publication Data

US 2011/0249416 A1 Oct. 13, 2011

(30) Foreign Application Priority Data

Apr. 8, 2010 (JP) ................................. 2010-089577

(51) Int. Cl.
*H05K 7/00* (2006.01)
*H05K 3/28* (2006.01)
(52) U.S. Cl.
CPC ..................................... *H05K 3/284* (2013.01)
USPC ......................................... 361/760; 361/763
(58) Field of Classification Search
CPC ..... H05K 3/284; H05K 1/0215; H05K 1/0218; H05K 1/023; H05K 3/0052; H05K 2201/0715; H05K 2201/10204

USPC ................... 361/760, 763, 321.2, 321.1, 748, 361/767; 29/832
See application file for complete search history.

(56) References Cited

U.S. PATENT DOCUMENTS

| 2004/0178500 | A1 | 9/2004 | Usui | |
| 2007/0247821 | A1* | 10/2007 | Kobayakawa et al. | 361/743 |
| 2011/0157768 | A1* | 6/2011 | Hur et al. | 361/321.2 |
| 2011/0229708 | A1* | 9/2011 | Asami et al. | 428/316.6 |

FOREIGN PATENT DOCUMENTS

| JP | 2004-172176 A | 6/2004 |
| JP | 2004-297054 A | 10/2004 |
| JP | 2006-203652 A | 8/2006 |
| JP | 2010-027996 A | 2/2010 |

\* cited by examiner

*Primary Examiner* — Yuriy Semenenko
(74) *Attorney, Agent, or Firm* — Keating & Bennett, LLP

(57) ABSTRACT

In a circuit module, a chip element is mounted on a mount electrode, with an outer electrode interposed therebetween. The chip element is arranged such that a cut surface thereof is oriented toward a side of a circuit module that is adjacent to the mount electrode. A gap that is observable from outside of the circuit module is provided between a bottom surface of a base of the chip element and a top surface of a circuit board.

4 Claims, 6 Drawing Sheets

CIRCUIT MODULE

BACKGROUND OF THE INVENTION

1. Field of the Invention

The present invention relates to a circuit module that includes a circuit board including mount components on a surface thereof, and an insulating layer covering the mount components. In particular, the present invention relates to a circuit module that allows checking of filling properties of an insulating resin layer between a circuit board and mount components.

2. Description of the Related Art

As an example of a circuit module of the related art, a circuit module described in Japanese Unexamined Patent Application Publication No. 2006-203652 is known. FIG. 6 is a cross-sectional view of this circuit module. As illustrated, a circuit module 10 includes a circuit board 12 having an inner electrode pattern composed of via holes and in-plane wiring electrodes; mount components 11, 13, 15, and 17 mounted on one principal surface of the circuit board 12; and an insulating resin layer 19 formed on the one principal surface of the circuit board 12 to cover the mount components 11, 13, 15, and 17.

The mount components 11, 13, 15, and 17 are mounted on the one principal surface of the circuit board 12 by a technique such as solder bonding or thermocompression bonding, and are connected to the inner electrode pattern of the circuit board 12. For example, the mount components 11, 15, and 17 are mounted on the circuit board 12, with connection conductors 14 interposed therebetween. In a space between the one principal surface of the circuit board 12 and bottom surfaces of the mount components 11, 15, and 17, gaps having a height of the connection conductors 14 are created in portions where no connection conductor 14 is present.

The insulating resin layer 19 is formed to entirely cover the mount components 11, 13, 15, and 17 including the gaps described above. The insulating resin layer 19 not only reinforces the mechanical connection between the circuit board 12 and the mount components 11, 13, 15, and 17, but also prevents the mount components 11, 13, 15, and 17 from being damaged by external shock.

To lower the profile of the circuit module 10, the connection conductors 14 are often designed to be low in height. This means that the height of the gaps between the circuit board 12 and the mount components 11, 15, and 17 is very small (about several tens of micrometers).

Therefore, when the insulating resin layer 19 is formed on the circuit board 12, the gaps may not be fully filled with the insulating resin layer 19 and air bubbles may remain. In this case, when the circuit module 10 is solder-bonded to a printed wiring board or the like by reflowing which involves heating, the resulting thermal expansion of the remaining air bubbles may cause cracks in the insulating resin layer 19 or the mount components 11, 15, and 17.

Moreover, if moisture remains in the air bubbles or gradually permeates through the insulating resin layer 19 and accumulates in the air bubbles, outer electrodes of the mount components 11, 15, and 17 may be corroded.

The presence of the air bubbles may weaken the mechanical connection between the circuit board 12 and the mount components 11, 15, and 17.

SUMMARY OF THE INVENTION

To overcome the problems described above, preferred embodiments of the present invention provide a circuit module which allows checking for air bubbles between a circuit board and mount components after formation of an insulating resin layer, and thus makes it possible to reliably prevent shipment of defective products containing air bubbles.

A circuit module according to a preferred embodiment of the present invention includes a substrate, mount components mounted on one principal surface of the substrate, an insulating layer arranged to cover the mount components, a mount electrode located at an end portion of the one principal surface of the substrate, and a chip element obtained by cutting an electronic component including outer electrodes which are folded electrodes disposed on both end surfaces of the electronic component. The chip element is mounted on the mount electrode, with one of the outer electrodes interposed therebetween, such that a cut surface of the chip element is oriented toward a side of the circuit module that is adjacent to the mount electrode.

In this case, the chip element is cut at an end surface of the circuit module and the height of a gap between the chip element and the substrate can be increased by the thickness of the outer electrode. It is thus possible, from outside the circuit module, to check for air bubbles in the gap in the insulating layer.

In the circuit module described above, the mount electrode may preferably be connected to a ground, and the chip element may be obtained by cutting the electronic component including an inner electrode electrically connected to the outer electrodes, such that at least a portion of the inner electrode is exposed. The circuit module may preferably further include a shield conductive layer electrically connected to the exposed portion of the inner electrode in the cut surface, the shield conductive layer being configured to cover the insulating layer.

In this case, since the mount components on the substrate are covered with the shield conductive layer connected to the ground, the mount components can be prevented from being affected by external electromagnetic fields and static electricity.

The circuit module described above may preferably include about two or more mount electrodes and about two or more chip elements surface-mounted on the respective mount electrodes, for example.

In this case, since a plurality of chip elements are mounted on the substrate, it is possible to more reliably check for air bubbles.

According to various preferred embodiments of the present invention, in a circuit module that includes a circuit board including mount components on a surface thereof and an insulating resin layer covering the mount components, it is possible to reliably detect the presence of air bubbles remaining in the insulating resin layer. Thus, the reliability of circuit modules to be shipped can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
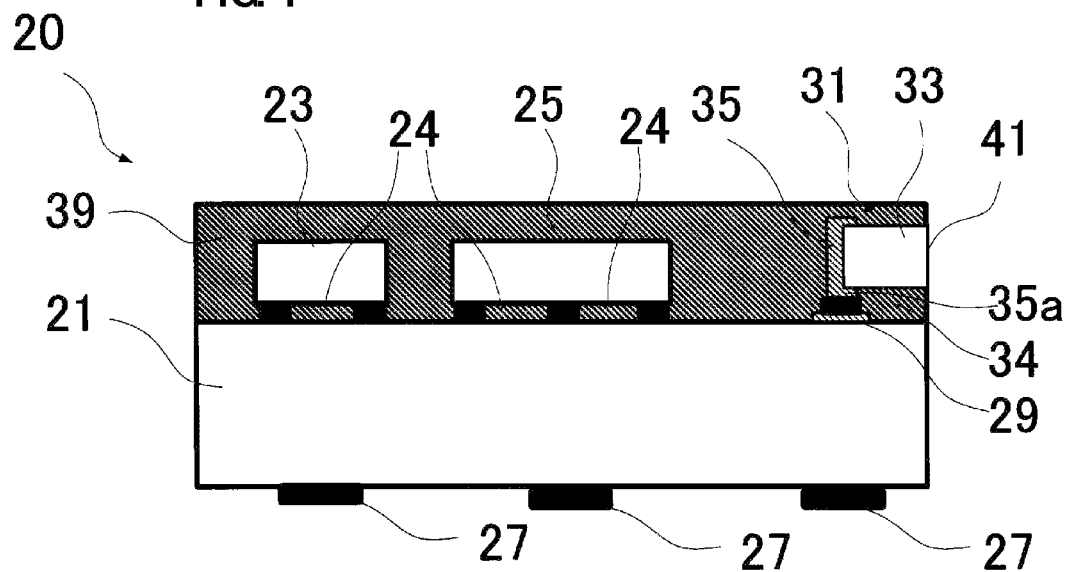
FIG. 1 is a cross-sectional view of a circuit module according to a first preferred embodiment of the present invention.

Preferred embodiments of the present invention will now be described in detail with reference to the drawings.
First Preferred Embodiment FIG. 1 is a cross-sectional view of a circuit module according to a first preferred embodiment of the present invention. A circuit module 20 includes, for example, a circuit board 21 preferably having a substantially rectangular parallelepiped shape and measuring about 10.0 mm by about 10.0 mm by about 1.2 mm, for example, surface-mount type mount components and 25 which are semiconductor devices mounted on a top surface of the circuit board 21, and a chip element 31. A configuration of the chip element 31 will be described in detail below.

The mount components 23 and 25 do not have to be semiconductor devices, but may be capacitors, resistors, surface acoustic wave (SAW) filters, or the like, depending on the function of the circuit module 20.

The circuit board 21 may be a ceramic multilayer substrate primarily made of ceramic material, or a resin multilayer substrate primarily made of resin material, for example. A multilayer substrate is formed preferably by stacking a plurality of substrates having in-plane wiring electrodes. The in-plane wiring electrodes in different layers and the mount components 23 and 25 are connected to each other through via holes.

The mount components 23 and 25 are connected by solder bonding to bonding pads (not shown) on the top surface of the circuit board 21. Gaps 24 having the height of the solder are created between the top surface of the circuit board 21 and bottom surfaces of the mount components 23 and 25.

An insulating resin layer 39 is arranged on the top surface of the circuit board 21 to cover the mount components 23 and 25 and the chip element 31. The gaps 24 are filled with the insulating resin layer 39. The insulating resin layer 39 not only reinforces the connection of the mount components 23 and 25 and the chip element 31 to the circuit board 21, but also protects the mount components 23 and 25 and the chip element 31 from the external environment.

The insulating resin layer 39 is preferably made of thermosetting resin, such as epoxy resin, for example. For the purpose of controlling the strength, dielectric constant, temperature characteristics, and viscosity, the material of the insulating resin layer 39 may contain a filler component, such as ceramic.

Outer connection electrodes 27 are located on the bottom surface of the circuit board 21. The outer connection electrodes 27 are connected through an inner electrode pattern (not shown) of the circuit board 21 to the bonding pads described above.

A mount electrode 29 is located at an end portion of the top surface of the circuit board 21. The chip element 31 is connected to the mount electrode 29 by solder bonding, for example.

The chip element 31 will now be described in detail.

Figure 2:
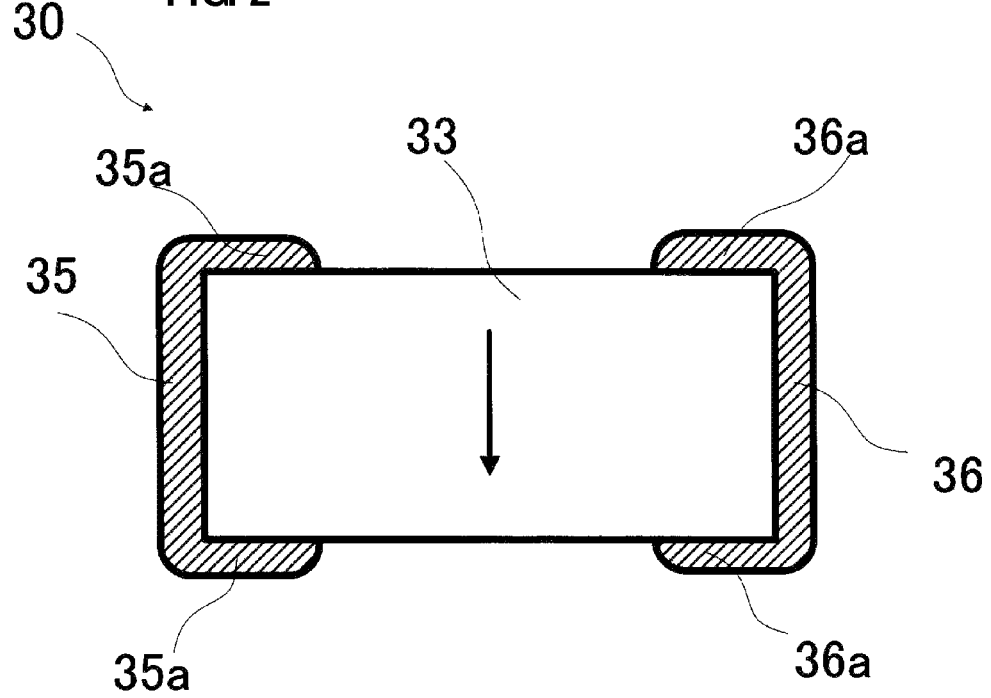
FIG. 2 is a cross-sectional view of an electronic component included in the first preferred embodiment of the present invention.

FIG. 2 is a cross-sectional view of an electronic component 30. The electronic component 30 includes a base 33 and outer electrodes 35 and 36. The chip element 31 is formed by cutting the electronic component 30. The outer electrodes 35 and 36 are formed preferably by a dip method which involves dipping the end portions of the base 33 into liquid conductive material. Thus, the outer electrodes 35 and 36 become folded electrodes including folded portions 35a and 36a that extend from end surfaces of the base 33 to both sides and upper and lower surfaces of the base 33.

The chip element 31 is obtained by cutting the electronic component 30 in a direction parallel to the end surfaces of the base 33 (i.e., in the direction of arrow in FIG. 2) such that the chip element 31 has only one outer electrode (e.g., outer electrode 35). The electronic component 30 is cut simultaneously with cutting the circuit board 21 from a collective substrate.

The chip element 31 is mounted on the mount electrode 29 with the outer electrode 35 interposed therebetween. The chip element 31 is arranged such that a cut surface 41 thereof is oriented toward a side of the circuit module 20 that is adjacent to the mount electrode 29. A gap 34 observable from outside of the circuit module 20 is created between the bottom surface of the base 33 of the chip element 31 and the top surface of the circuit board 21.

In the circuit module 20 of the present preferred embodiment, since the cut surface 41 of the chip element 31 is positioned near a side of the insulating resin layer 39, the gap can be checked from outside the insulating resin layer 39. Moreover, since the chip element 31 includes the folded portion 35a, the height of the gap 34 can be made higher than that of the gaps 24 by the thickness of the folded portion 35a. This allows for easy checking for air bubbles in the gap 34.

With the configuration described above, the presence of air bubbles in the circuit module 20 can be reliably detected after formation of the insulating resin layer 39.

Figure 3:
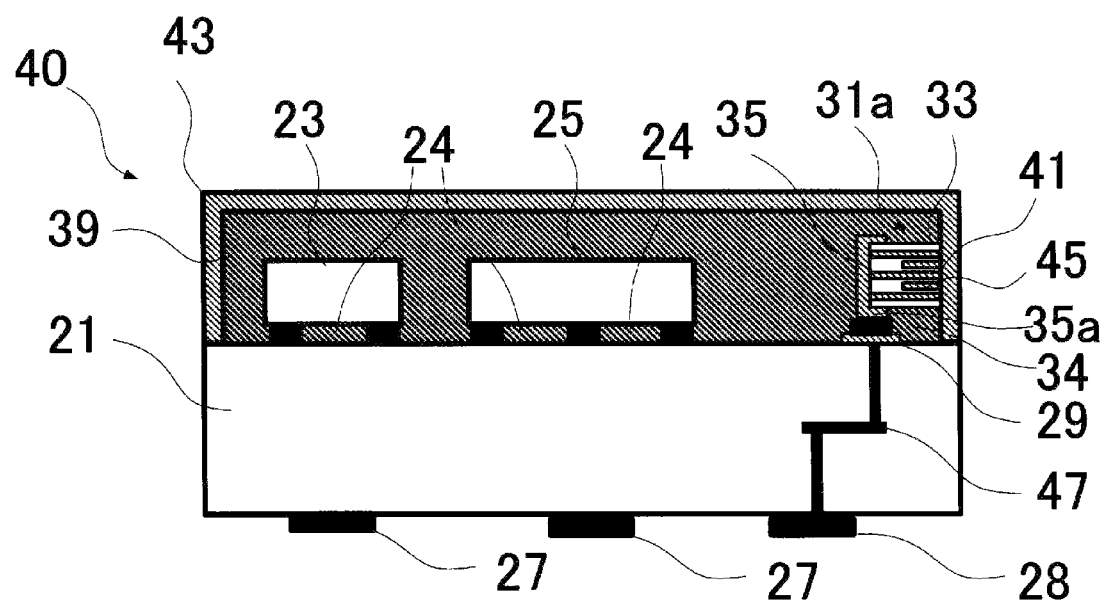
FIG. 3 is a cross-sectional view of a circuit module according to a second preferred embodiment of the present invention.

Although only one chip element 31 is preferably mounted on the circuit board 21 in the circuit module 20 of the present preferred embodiment, a plurality of chip elements 31 may be mounted on the circuit board 21. When the plurality of chip elements 31 are mounted on different end portions of the circuit board 21, it is possible to more reliably detect the presence of air bubbles.
Second Preferred Embodiment FIG. 3 is a cross-sectional view of a circuit module according to a second preferred embodiment of the present invention. A circuit module 40 includes a shield conductive layer 43 on the surface of the insulating resin layer 39. The shield conductive layer 43 is connected to an outer ground electrode 28, through a chip element 31a and an electrode pattern 47 including via holes and in-plane wiring electrodes. The other configurations of the second preferred embodiment will not be described here, as they are the same as those of the first preferred embodiment of the present invention.

Figure 4A:
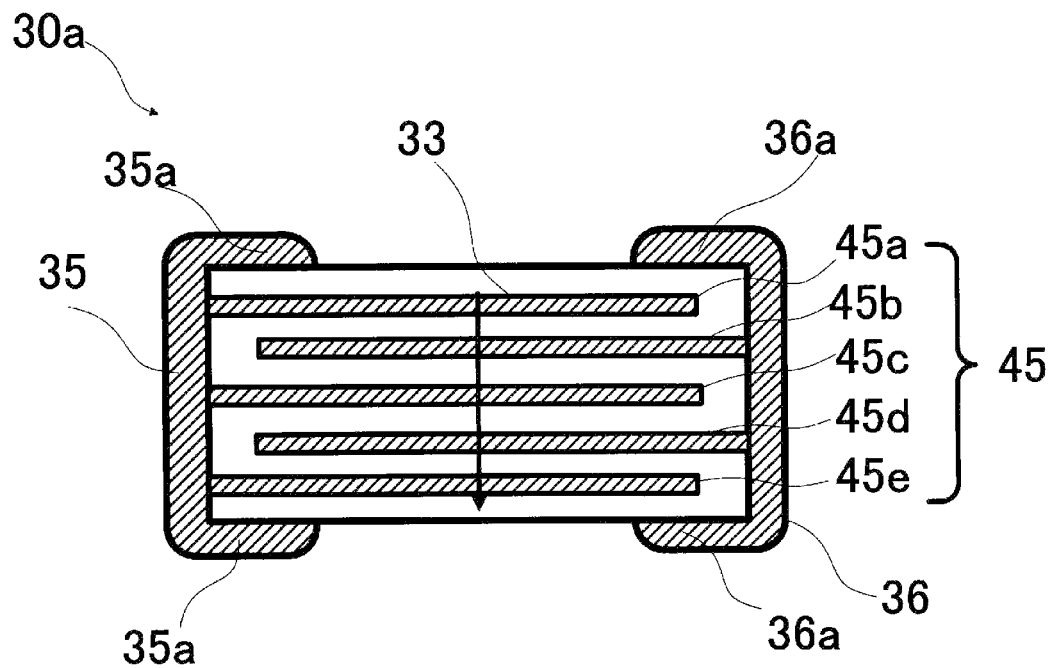
FIGS. 4A and FIG. 4B are cross-sectional views of an electronic component included in the second preferred embodiment of the present invention.

FIG. 4A is a cross-sectional view of an electronic component 30a. The electronic component 30a is different from the electronic component 30 described in the first preferred embodiment in that the base 33 is provided with an inner electrode 45. The chip element 31a is formed preferably by cutting the electronic component 30a.

Inner electrodes 45a, 45c, and 45e are connected to the outer electrode 35, and inner electrodes 45b and 45d are connected to the outer electrode 36. The electronic component 30a, where the inner electrodes 45a to 45e thereof overlap each other, has the same structure as that of a so-called monolithic capacitor.

The chip element 31a is obtained by cutting the electronic component 30a in a direction parallel to the end surfaces of the base 33 (i.e., in the direction of arrow in FIG. 4A) such that the chip element 31a has only one outer electrode (e.g., outer electrode 35).

As in the case of the first preferred embodiment, the electronic component 30a is cut simultaneously with the cutting of the circuit board 21 from a collective substrate.

Figure 4B:
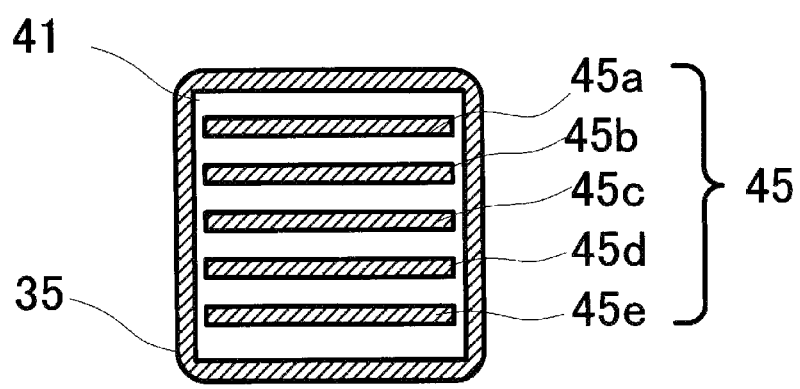

FIG. 4B is a front view of the cut surface 41 of the chip element 31a. Cutting the base 33 and the inner electrode 45 allows the inner electrodes 45a to 45e to be exposed to the cut surface 41.

The cut surface 41 of the chip element 31a mounted on the mount electrode 29 is exposed from the insulating resin layer 39.

The shield conductive layer 43 is arranged on the circuit board 21 to cover the surface of the insulating resin layer 39. The shield conductive layer 43 is in contact with the cut surface 41 of the chip element 31a. Therefore, the shield conductive layer 43 is electrically connected to the inner electrodes 45a to 45e of the chip element 31a.

For example, a conductive resin including a conductive component is preferably used in the shield conductive layer 43. Examples of the conductive component (filler) contained in the conductive resin include Ag, Cu, and Ni. Examples of a synthetic resin (binder) containing the conductive component include an epoxy resin, a phenolic resin, an urethane resin, a silicon resin, a polyester resin, an acrylic resin, and a polyimide resin.

The outer ground electrode 28 is located on the bottom surface of the circuit board 21. The outer ground electrode 28 is electrically connected, through the electrode pattern 47 including the via holes and in-plane wiring electrodes inside the circuit board 21, to the mount electrode 29 connected to the chip element 31a. Thus, the shield conductive layer 43 is electrically connected to the outer ground electrode 28 through a path defined by the inner electrodes 45a, 45c, and 45e, the outer electrode 35, the mount electrode 29, and the electrode pattern 47.

In the circuit module 40 of the present preferred embodiment, the shield conductive layer 43 connected to the outer ground electrode 28 is arranged on the circuit board 21 to cover the surface of the insulating resin layer 39. With this configuration, the mount components 23 and 25 on the circuit board 21 are entirely covered with the shield conductive layer 43. Thus, in addition to the effect described in the first preferred embodiment of the present invention, a shielding effect is achieved in which the circuit module 40 can be prevented from being affected by external electromagnetic noise.

Although a monolithic capacitor is used as the electronic component 30a in the present preferred embodiment, the electronic component 30a may be of any type that has an inner electrode exposed to the cut surface 41 and connected to an outer electrode. For example, a monolithic inductor or a monolithic chip resistor, instead of a monolithic capacitor, may be used as the electronic component 30a.

A method for manufacturing the circuit module 40 of the second preferred embodiment will now be described with reference to FIG. 5A to FIG. 5E. Elements corresponding to those illustrated in FIG. 3 will not be described in detail here.

Figure 5A:
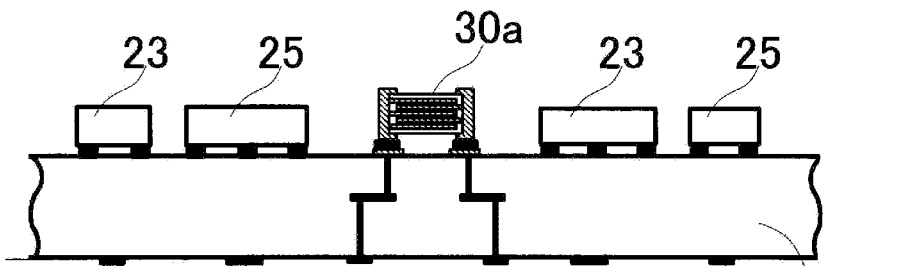
FIGS. 5A to FIG. 5E illustrate steps of manufacturing the circuit module according to the second preferred embodiment of the present invention.
Figure 5B:
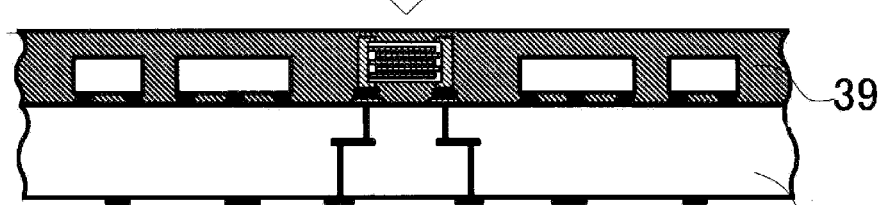
Figure 5C:
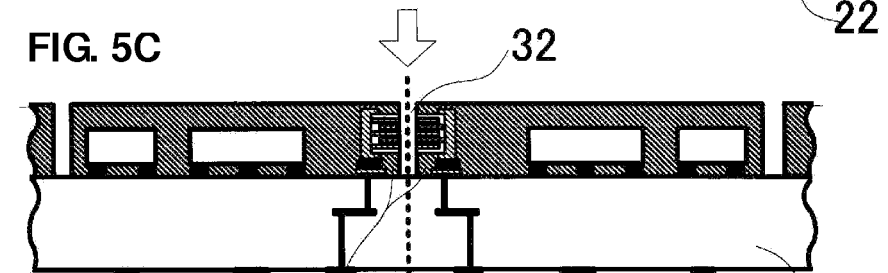
Figure 5D:
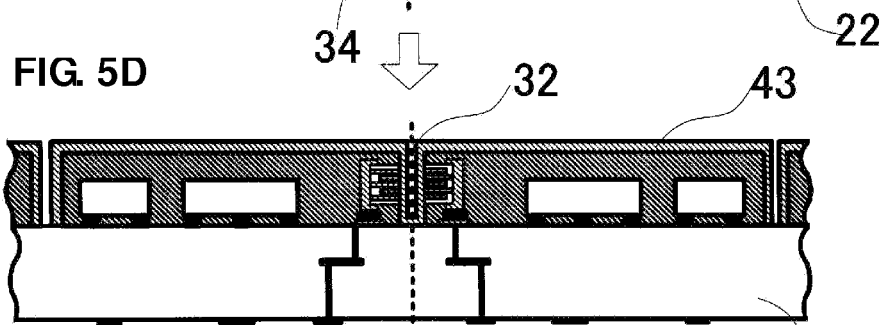
Figure 5E:
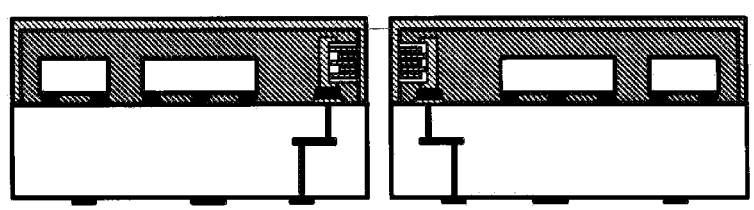
Figure 6:
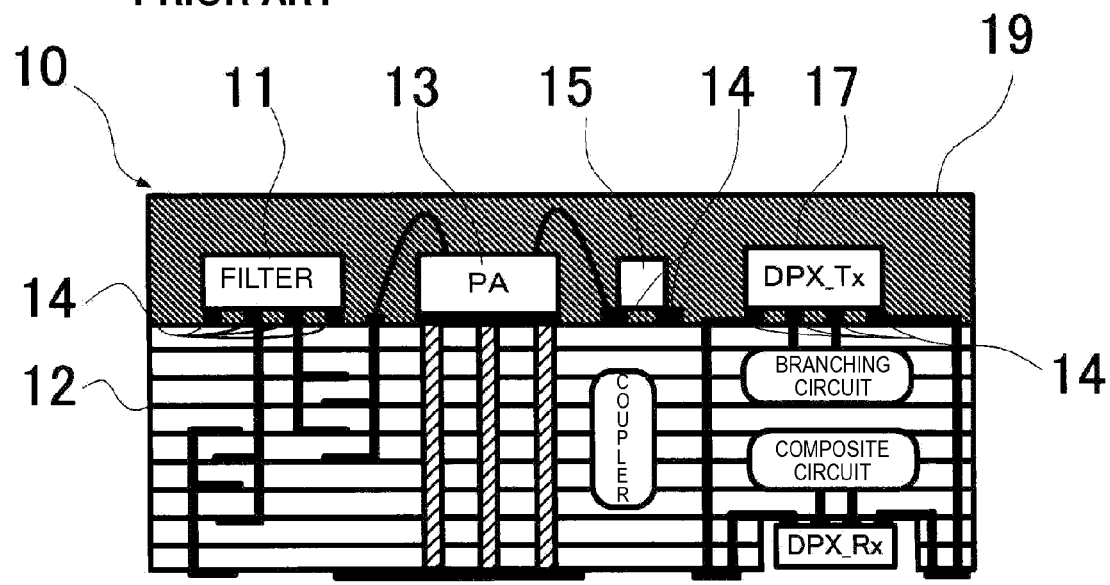
FIG. 6 is a cross-sectional view of a high-frequency module of the related art.

FIGS. 5A to FIG. 5E are cross-sectional views for describing a method for manufacturing the circuit module 40 of the second preferred embodiment. FIG. 5A illustrates a state in which the mount components 23 and 25 and the electronic component 30a are mounted on a top surface of a collective substrate 22. FIG. 5B illustrates a state in which the insulating resin layer 39 is formed on the top surface of the collective substrate 22 to cover the mount components 23 and 25 and the electronic component 30a. FIG. 5C illustrates a state in which a slit 32 is formed after the formation of the insulating resin layer 39. FIG. 5D illustrates a state in which the shield conductive layer 43 is formed. FIG. 5E illustrates a state in which the collective substrate 22 is completely divided.

A ceramic multilayer substrate is used here as an example of the circuit board 21. The collective substrate 22 can be obtained by stacking and firing a predetermined number of ceramic green sheets having via holes and in-plane wiring electrodes of a predetermined pattern. The collective substrate thus obtained includes a plurality of ceramic multilayer substrates, each having bonding pads (not shown) and the mount electrode 29 on the top and bottom surfaces thereof.

FIG. 5A is a cross-sectional view illustrating a state in which the mount components 23 and 25 and the electronic component 30a are mounted on the top surface of the collective substrate 22.

After solder is supplied by screen printing or the like to the bonding pads on the top surface of the collective substrate 22, the mount components 23 and 25 and the electronic component 30a are placed on the bonding pads. Then, the collective substrate 22 is placed in a reflow oven, where the solder is melted and solidified. Thus, the mount components 23 and 25 and the electronic component 30a are mounted on ceramic multilayer substrates.

FIG. 5B is a cross-sectional view illustrating a state in which the insulating resin layer 39 is formed on the top surface of the collective substrate 22 to cover the mount components 23 and 25 and the electronic component 30a. The insulating resin layer 39 is formed, for example, by transfer molding, potting, or vacuum printing.

FIG. 5C is a cross-sectional view illustrating a state in which the slit 32 is formed after the formation of the insulating resin layer 39. At a boundary between adjacent circuit modules 40 to be cut out, the slit 32 having a groove-like form is cut to a predetermined depth by a blade or the like. Forming the slit 32 allows each gap 34 to be exposed to the corresponding side of the insulating resin layer 39. Checking the gap 34 allows checking for air bubbles inside the insulating resin layer 39.

As long as the gap 34 is exposed, the slit 32 may be cut down to a position in the middle of either the insulating resin layer 39 or the collective substrate 22.

FIG. 5D is a cross-sectional view illustrating a state in which the shield conductive layer 43 is formed. The shield conductive layer 43 is applied to the insulating resin layer 39, including the slit 32, by a dispenser, a vacuum printer, a spin coater, or the like. The shield conductive layer 43 is thus connected to the inner electrode 45 of each chip element 31a. Shielding properties can be improved by applying the shield conductive layer 43, as illustrated in FIG. 5D, such that each slit 32 is fully filled with the shield conductive layer 43.

FIG. 5E is a cross-sectional view illustrating a state in which the collective substrate 22 is completely divided. After the shield conductive layer 43 is formed, each slit 32 is further cut by the blade or the like, so that the collective substrate 22 is divided into individual circuit modules 40.

In the manufacture of circuit modules 20 of the first preferred embodiment, which are provided with no shield conductive layer, each slit 32 is cut to the bottom of the collective substrate 22 in the step of FIG. 5C. Thus, the collective substrate 22 is divided into individual circuit modules 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a substrate;
   mount components mounted on one principal surface of the substrate;
   an insulating layer arranged to cover the mount components;
   a mount electrode located at an end portion of the one principal surface of the substrate; and
   a chip element obtained by cutting an electronic component including outer electrodes which are folded electrodes disposed on both end surfaces of the electronic component; wherein
   the chip element is mounted on the mount electrode, with one of the outer electrodes interposed therebetween, such that a cut surface of the chip element is oriented toward a side of the circuit module that is adjacent to the mount electrode.

2. The circuit module according to claim 1, wherein the mount electrode is connected to a ground; and
   the chip element is obtained by cutting the electronic component including an inner electrode electrically connected to the outer electrodes, such that at least a portion of the inner electrode is exposed;
   the circuit module further comprising a shield conductive layer electrically connected to the exposed portion of the inner electrode in the cut surface, the shield conductive layer being arranged to cover the insulating layer.

3. The circuit module according to claim 1, wherein the circuit module includes two or more mount electrodes and two or more chip elements surface-mounted on the respective mount electrodes.

4. A method for manufacturing a circuit module, comprising the steps of:
   preparing a collective substrate including a plurality of substrates each including mount components on one principal surface thereof;
   mounting an electronic component on the one principal surface of the collective substrate such that the electronic component is located across a boundary between adjacent substrates, the electronic component including outer electrodes which are folded electrodes and an inner electrode electrically connected to the outer electrodes;
   forming an insulating layer on the one principal surface of the collective substrate to cover the mount components and the electronic component;
   forming a slit by cutting the electronic component such that the inner electrode is exposed, the slit extending from a top surface of the insulating layer to a position in the insulating layer between a bottom surface of the electronic component and the one principal surface of the collective substrate or to a position inside the collective substrate; and
   forming a shield conductive layer over the slit and the top surface of the insulating layer, the shield conductive layer being electrically connected to the inner electrode.

* * * * *